United States Patent
Bruce

(10) Patent No.: US 6,757,845 B2
(45) Date of Patent: Jun. 29, 2004

(54) METHOD AND APPARATUS FOR TESTING A STORAGE DEVICE

(75) Inventor: Ross H. Bruce, Fremont, CA (US)

(73) Assignee: BiTMICRO Networks, Inc., Fremont, CA (US)

( * ) Notice: Subject to any disclaimer, the term of this patent is extended or adjusted under 35 U.S.C. 154(b) by 449 days.

(21) Appl. No.: 09/727,432

(22) Filed: Nov. 30, 2000

(65) Prior Publication Data

US 2002/0095623 A1 Jul. 18, 2002

(51) Int. Cl.⁷ ............................................... G06F 11/00
(52) U.S. Cl. ........................ 714/32; 714/49; 714/54; 714/718; 714/738; 714/739; 365/201
(58) Field of Search .............................. 714/32, 54, 49, 714/719, 718, 5, 6, 742, 743, 738, 739; 360/53; 365/201

(56) References Cited

U.S. PATENT DOCUMENTS

| | | | | |
|---|---|---|---|---|
| 5,153,885 A | * | 10/1992 | Azumatani et al. | 714/719 |
| 5,630,054 A | * | 5/1997 | Trang | 714/52 |
| 5,717,535 A | * | 2/1998 | French et al. | 360/53 |
| 6,021,515 A | * | 2/2000 | Shimura | 714/738 |
| 6,098,190 A | * | 8/2000 | Rust et al. | 714/763 |
| 6,370,665 B1 | * | 4/2002 | Noguchi | 714/738 |
| 6,535,841 B1 | * | 3/2003 | Meyer | 703/13 |
| 2002/0046359 A1 | * | 4/2002 | Boden | 714/6 |

OTHER PUBLICATIONS

Free Online Dictionary of Computing definition of Logical Block Addressing. Apr. 30, 2000.*

* cited by examiner

Primary Examiner—Robert Beausoliel
Assistant Examiner—Yolanda L Wilson
(74) Attorney, Agent, or Firm—Stephen Uriate; Shabneez Kotadia

(57) ABSTRACT

The present invention pertains to a method of writing test data in a memory space within a memory store and includes: generating a header having an address representing the location of the memory space in the memory store, and a seed value; generating test data using the seed value; and storing the header and the test data in the memory space. Another embodiment of the present invention pertains to a method of testing a memory space within a memory store that includes: generating a header having an address representing the location of the memory space in the memory store, and a seed value; generating a set of values using the seed value; storing the header and the set of values in the memory space; retrieving data from the memory space; generating a new seed value using the set of values; and comparing the new seed value with the seed value. The present invention may be embodied in an apparatus for testing a memory space within a memory store that includes: a computer having a storage device interface controller; a storage device having an interface suitable for coupling to said storage device interface controller and the memory store; a first function for generating a header having an address representing the location of the memory space in the memory store, and a seed value; a second function for generating a set of values using said seed value; and a third function for storing said header and said set of values in the memory space.

18 Claims, 6 Drawing Sheets

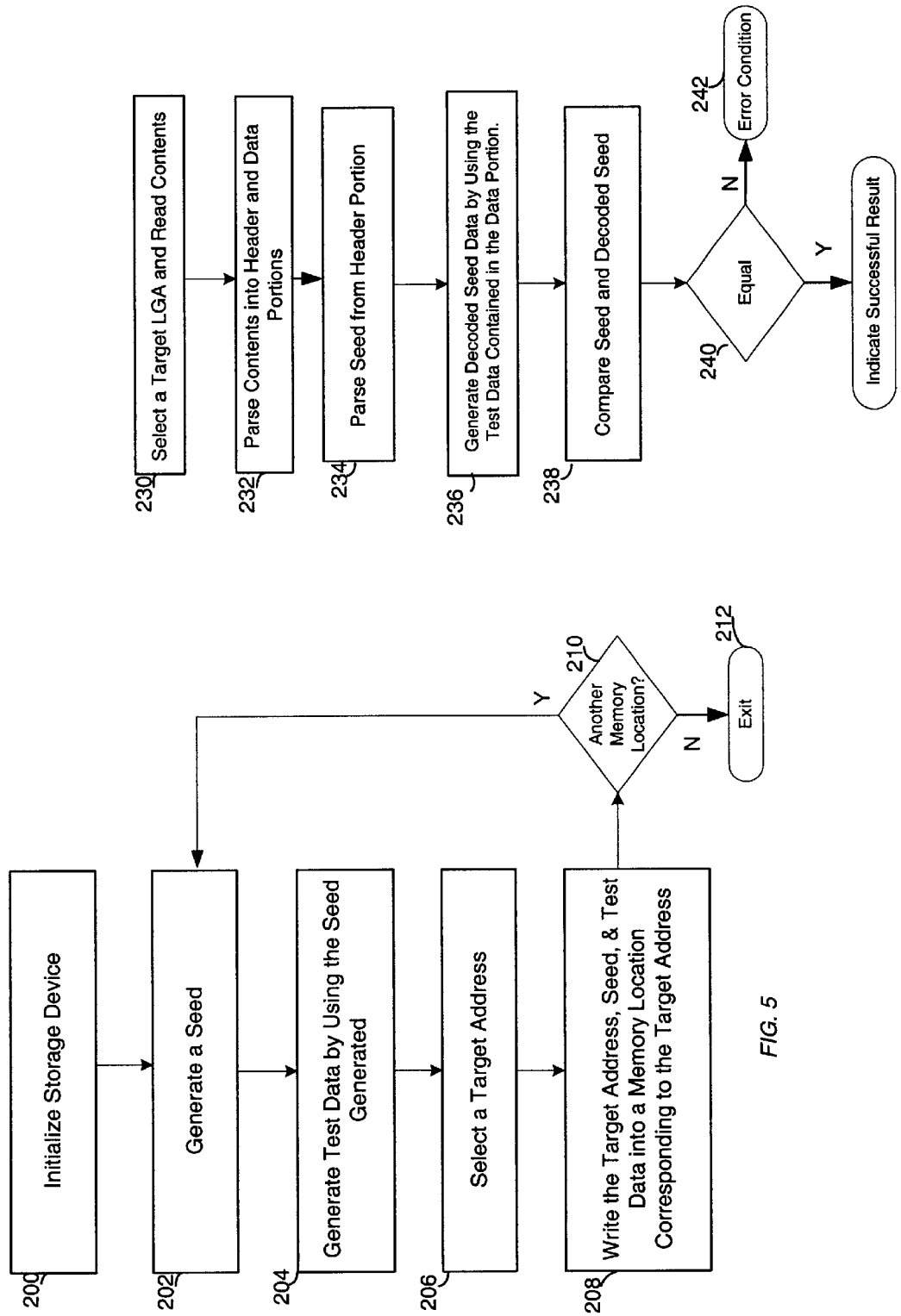

| Target Address | Seed | 0x04 | 0xFD | 0xFD,0xFE,0xFF,0x00...0FC<br>0xFD,0xFE,0xFF,0x00...0FC<br>...<br>0xFD,0xFE,0xFF,0x00...0FC |

300 — 0x04
302 — 0xFD

FIG. 10

| Target Address | Seed | 0x03 | 0x55 | 0x55 0x55 ....0x55<br>0x55 0x55 ....0x55<br>...<br>0x55 0x55 ....0x55 |

| Target Address | Seed | 0x03 | 0xAA | 0xAA 0xAA ....0xAA<br>0xAA 0xAA ....0xAA<br>...<br>0xAA 0xAA ....0xAA |

300 — 0x03
302 — 0xAA / 0x55

METHOD AND APPARATUS FOR TESTING A STORAGE DEVICE

FIELD OF THE INVENTION

The present invention pertains to a method and apparatus for testing a storage device. More particularly, the present invention pertains to a method and apparatus for testing storage device I/O functionality during a storage operation, such as a write, read, or erase operation.

BACKGROUND OF THE INVENTION

The term storage device is commonly used to refer to hard disk drives, which have moving parts, and to solid-state memory devices, which use solid-state memory as their main storage medium and a device interface commonly found in hard disk drives. Testing a storage device may include repeatedly writing and reading test data across selected or all memory locations available on the drive. Erase operations may also be performed. The test data and its address must be tracked or accounted for so that data subsequently read at the same address may be verified. Test data verification and hence, I/O functionality testing becomes increasingly more difficult to accomplish since it may become difficult to distinguish between similar test data that were written at adjacent locations at different time intervals. Increasing the number of different types of test data may reduce confusion between test data stored at adjacent addresses but adds complexity. Moreover, as storage device capacity increases, testing write, erase, and/or read functionality becomes more difficult since more address locations must be tested as capacity increases. Consequently, there is a need for an improved method and apparatus for testing the I/O functionality of storage devices.

SUMMARY OF THE DISCLOSURE

In accordance with one embodiment of the present invention, a method of writing test data in a memory space within a memory store includes: generating a header having an address representing the location of the memory space in the memory store, and a seed value; generating test data using the seed value; and storing the header and the test data in the memory space.

In accordance with another embodiment of the present invention, a method of testing a memory space within a memory store includes: generating a header having an address representing the location of the memory space in the memory store, and a seed value; generating a set of values using the seed value; storing the header and the set of values in the memory space; retrieving data from the memory space; generating a new seed value using the set of values; and comparing the new seed value with the seed value.

In accordance with yet another embodiment of the present invention, an apparatus for testing a memory space within a memory store includes: a computer having a storage device interface controller; a storage device having an interface suitable for coupling to said storage device interface controller and the memory store; a first function for generating a header having an address representing the location of the memory space in the memory store, and a seed value; a second function for generating a set of values using said seed value; and a third function for storing said header and said set of values in the memory space.

In accordance with a further embodiment of the present invention, an apparatus for testing a memory space within a memory store includes: a computer having a storage device interface controller; a storage device having an interface suitable for coupling to said storage device interface controller and the memory store; a first function for generating a header having an address representing the location of the memory space in the memory store, and a seed value; a second function for generating a set of values using said seed value; a third function for storing said header and said set of values in the memory space; a fourth function for retrieving data from the memory space; a fifth function for generating a new seed value using said set of values; and a sixth function for comparing said new seed value with said seed value.

BRIEF DESCRIPTION OF THE DRAWINGS

The accompanying drawings, which are incorporated in and form a part of this specification, illustrate embodiments of the present invention and, together with the description, serve to explain the principles of the invention.

FIG. 5 is a flow diagram showing a method of writing test data into addressable memory locations defined in a storage device, in accordance with another preferred embodiment of the present invention.

FIG. 6 is a program flow for testing the storage operation of a storage device having data stored in accordance with yet another preferred embodiment of the present invention.

FIG. 7 is a block diagram showing another example sector configuration for a storage device selected for testing in accordance with a further embodiment of the present invention.

FIGS. 8–12 are block diagrams showing various sector configurations suitable for use in testing a storage device in accordance with a yet another embodiment of the present invention.

DETAILED DESCRIPTION OF THE PREFERRED EMBODIMENTS

In the following description, a preferred embodiment of the invention is described with regard to preferred process steps and data structures. Those skilled in the art would recognize after perusal of this application that embodiments of the invention can be implemented using one or more general purpose processors operating under program control, or special purpose processors adapted to particular process steps and data structures, and that implementation of the process steps and data structures described herein would not require undue experimentation or further invention.

Figure 1:
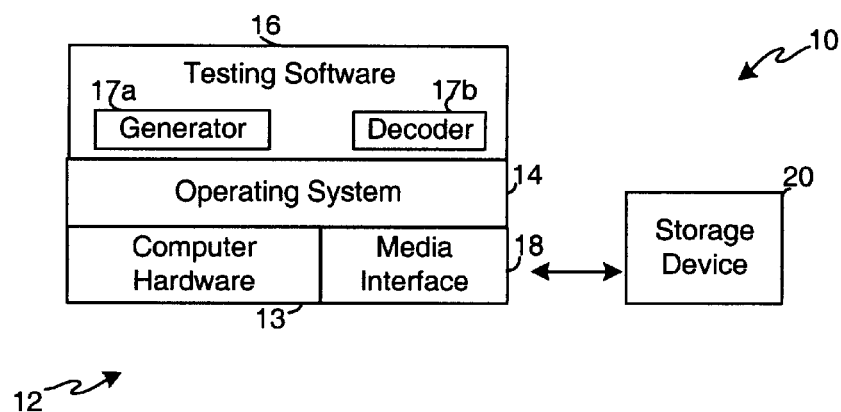
FIG. 1 is a block diagram depicting an apparatus for testing the I/O functionality of a storage device, in accordance with one embodiment of the present invention.

FIG. 1 is a block diagram depicting an apparatus for testing the I/O functionality of a storage device, in accordance with one preferred embodiment of the present invention. The apparatus 10 includes a computer system 12 comprising computer hardware 13, an operating system 14, and program code 16. Preferably, the operating system is Microsoft Windows compatible, such as the Microsoft™ Windows® 98 operating system. Computer hardware 13 includes a motherboard having a PCI bus, system memory of at least 64 Mbytes, video adapter, and keyboard and mouse interfaces, which are commonly known and are not shown to avoid overcomplicating the herein disclosure. Computer hardware 13 also includes a media interface 18 that is capable of communicating with a storage device 20. The type of media interface 18 used is dependent on the device interface used by storage device 20. If storage device 20 uses a SCSI (small computer system interface) device interface then media interface 18 is implemented using a SCSI host bus adapter. Similarly, if storage device 20 uses an ATA (AT Attached) or IDE (Integrated Device Electronics) device interface, then media interface 18 is implemented using an ATA or IDE device controller. Storage device 20 may be obtained from BiTMICRO NETWORKS, Inc. of Fremont, Calif. and in various device interface configurations, including the SCSI and ATA device interfaces. In the preferred embodiment, media interface 18 couples to computer system 12 using the PCI bus. Those of ordinary skill in the art will readily recognize that the apparatus described in FIG. 1 is not intended to be limited solely to the embodiments disclosed but may include or may be comprised of other embodiments that are within the scope and spirit of the present disclosure.

Program code 16 is preferably written in C or C++ or in any other type of programming language, which when compiled into executable code, is suitable for use with the operating system selected for computer system 12 and when executed on computer system 12, provides the functionality disclosed herein. Program code 16 includes a psuedo-random number generator ("Generator") 17a for generating test data. Program code 16 may also include a psuedo-random number decoder ("Decoder") 17b that generates a seed from test data received by Decoder 17a. Preferably, Generator 17a and Decoder 17b are complements of each other. As known by those of ordinary skill in the art, a random number generator does not generate truly random numbers. Instead, the generator generates a sequence of numbers that approximate a sequence of random numbers, which in one preferred embodiment of the present invention are used as test data. Generator 17a generates test data using the seed that it receives as its input parameters. The seed used and the test data generated by the generator have a one to one relationship. If the same seed is repeatedly used as an input parameter, Generator 17a will repeatedly generate the same test data. However, Generator 17a will never generate the same test data from two different seeds.

Decoder 17b, on the other hand, generates a seed by using the test data it receives as its input parameters. The seed generated and the test data received by Decoder 17b have a one to one relationship. If the same test data is repeatedly used to generate a seed, Decoder 17b will repeatedly generate the same seed until different test data are used as input parameters. The Decoder 17b will never generate the same seed from two different sets of test data. Moreover, since Generator 17a and Decoder 17b are complements of each other, any test data generated by Generator 17a and subsequently used as input parameters for Decoder 17b will result in Decoder 17b generating a seed that is equivalent to the seed initially used as an input parameter to Generator 17a, and vice versa.

Program code 16 also includes initialization and I/O algorithms (not shown). The initialization algorithm initializes storage device 20 to have a LBA (logical block addressing) scheme, and the I/O algorithm writes, reads, and/or erases selected units of memory space available within storage device 20.

Initialization of storage device 20 may include imposing a logical block-addressing scheme by assigning a unique logical block address to each physical memory location selected and available on the storage device. For example, each logical block address may be used to represent at least one unit of memory space with each unit having a unit size of 512 bytes of available memory. The unit size of 512 bytes is not intended to be limiting and other unit sizes may be used without departing from the scope and spirit of the herein disclosure. Those of ordinary skill in the art will readily recognize that a unit of memory space equivalent to 512 bytes of available memory is commonly referred to as a sector or page.

Figure 2:
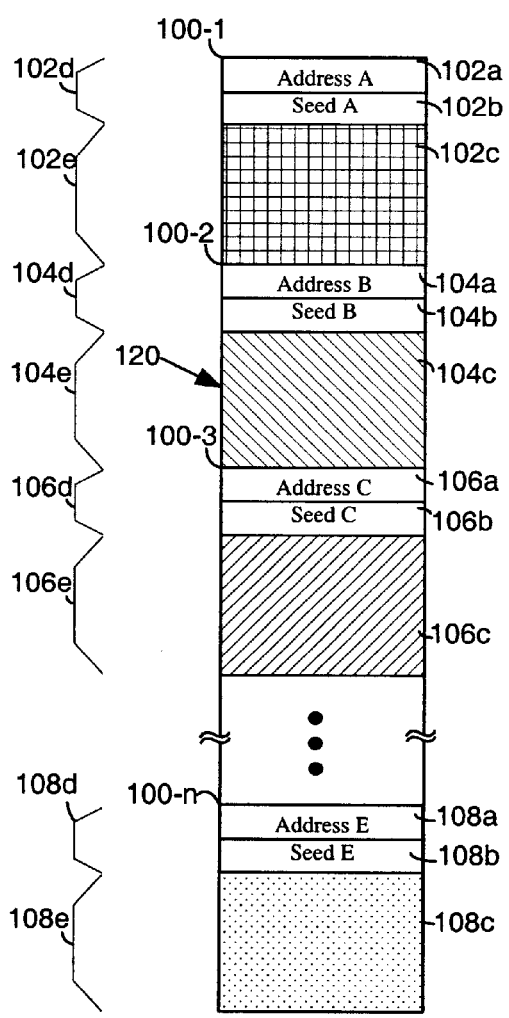
FIG. 2 is a block diagram showing an example sector configuration for a storage device selected for testing in accordance with one embodiment of the present invention.

Storage device 20 may be initialized to have sectors having logical block addresses of 100-1 through 100-n respectively, as shown in FIG. 2. The number of sectors and the format of the LBAs shown are for example purposes only and are not intended to limit the teachings of the invention in any way. Each sector is associated with a unique logical block address, which is used as the starting address for each respective sector. For each sector selected for testing, a target address, seed, and test data are stored in predetermined locations within each selected sector. For each write operation performed on a sector selected for I/O testing, a target address and seed are stored in a header associated with the sector. The target address stored matches the logical block address corresponding to the sector selected for testing. The header is eight (8) contiguous bytes long, with the beginning boundary of the header starting at the sector's LBA. The first four bytes of the header are reserved for storing a target address and the second four bytes of the header is reserved for storing a seed. In addition, test data is stored in a data portion associated with the sector. The data portion starts at the end of the header, which in this example is a location offset by eight (8) bytes from the sector's LBA. The data portion ends at a memory location 512 bytes offset from the LBA of the sector, assuming the sector is comprised of 512 bytes and resulting in a sector data portion size of 504 bytes.

When testing the I/O function of storage device 20, program code 16 may write a target address 102a, seed 102b, and test data 102c in the sector having LBA 100-1 in memory locations representing a header 102d and data portion 102e, as shown in FIG. 2. Additional sectors may also be tested as well by writing a target address 104a, seed 104b, and test data 104c in sector LBA 100-2 in memory locations representing a header 104d and data portion 104e, and a target address 106a, seed 106b, and test data 106c in the sector having LBA 100-3 in memory locations representing a header 106d and data portion 106e. Further, a target address 108a, seed 108b, and test data 108c may be written in the sector having LBA 100-n in memory locations representing a header 108d and data portion 108e.

By storing a unique seed in each sector, storage device I/O functionality testing can be performed without the need to maintain a copy of each set of test data written to a sector. Since a sector selected for testing contains a header having a unique seed, a pseudo-random number decoder, such as Decoder 17b, may be used to generate a decoded seed using the test data read from the data portion of the sector. Because Decoder 17b contains an algorithm complementary to that used by Generator 17a, the decoded seed will match the seed read from the selected sector if the test data read from the data portion of the sector matches the test data previously used to encode the seed saved in the sector. Thus, if the test data is properly written in the correct location, is not subsequently modified, corrupted, or erased, and properly read from the selected sector, the decoded seed should match the seed read from the selected sector. If so, program code 16 will treat the matching result as an indication that the I/O operation of the storage device for the selected sector was properly performed. If the decoded seed does not match, then the I/O operation of the storage device is faulty and needs to be corrected. In accordance with one preferred embodiment of the present invention, the comparison of the decoded seed and the seed read from the selected sector is performed by a compare function included with program code 16. Specifically, the compare function (not shown) receives the decoded seed from Decoder 17*b* and compares the decoded seed with the seed read from the selected sector, such as seed 104*b*. Thus, by storing the seed with the test data generated using the seed in the same sector, the proper write, read, and/or erase functionality of a storage device can tested without keeping a separate known copy of the tested information since the information needed to verify the test data is itself and its corresponding seed. Moreover, storing a target address in a sector permits the present invention to determine during a subsequent read operation whether the starting location of the sector being read matches that of the sector previously written since the target address stored in the header of the sector being read can be compared with the logical block address used to read the sector. If the addresses match then the present invention assumes that the logical block address used to read the sector was the same logical block address used previously to write the sector.

For example, storage device 20 is requested to read data starting at LBA 100-2. However, instead of properly beginning its read operation at LBA 100-2, storage device begins its read operation at a starting LBA represented by reference 120. Since LBA represented by reference 120 is not the LBA previously used as a sector's starting LBA, the data read will not correspond to the data previously written. Specifically, the data read will represent test data and a seed that were not the same test data and seed previous written and that when processed by program code 16 will not match, causing program 16 to render an I/O fault condition.

Figure 3:
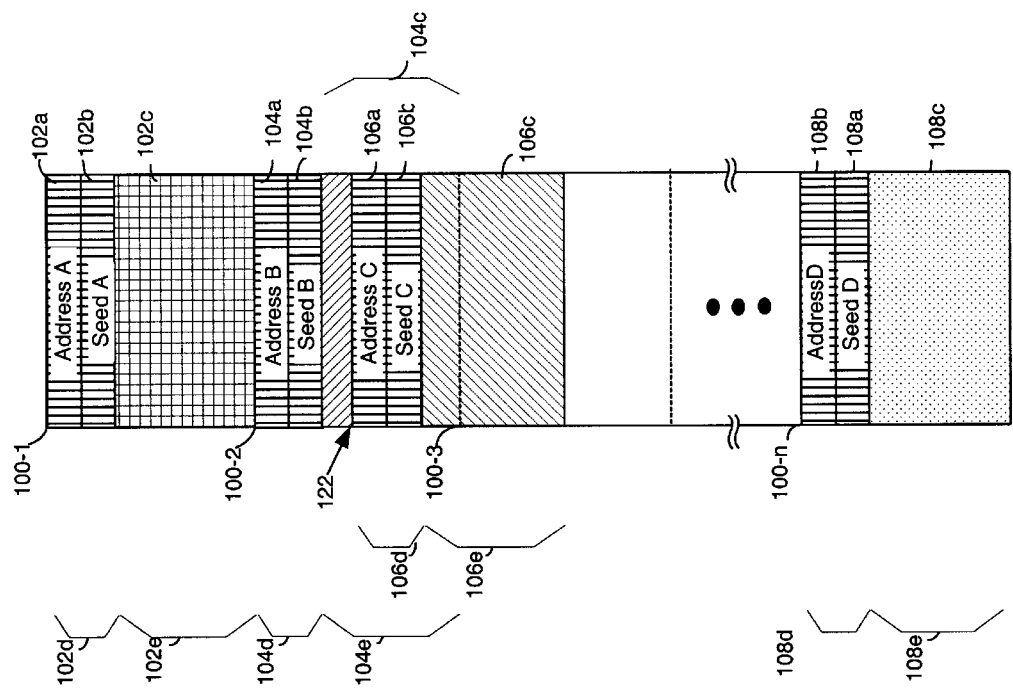
FIG. 3 is a block diagram showing a defective write operation performed by a storage device having an example sector configuration in accordance with one embodiment of the present invention.

In another example, as shown in FIG. 3, the exact same data shown in FIG. 2, is stored in storage device 20 but instead of storing data in the sector starting at LBA 100-3, storage device erroneously writes the data starting at a memory location 122, which previously contained portions of test data 104*c*. Since the sector having LBA 100-3 contains portions of test data 104*e* and 106*e*, the decoding of its contents will result in a seed that will not correspond to seed 104*b*, causing program 16 to render an I/O fault condition.

Figure 4:
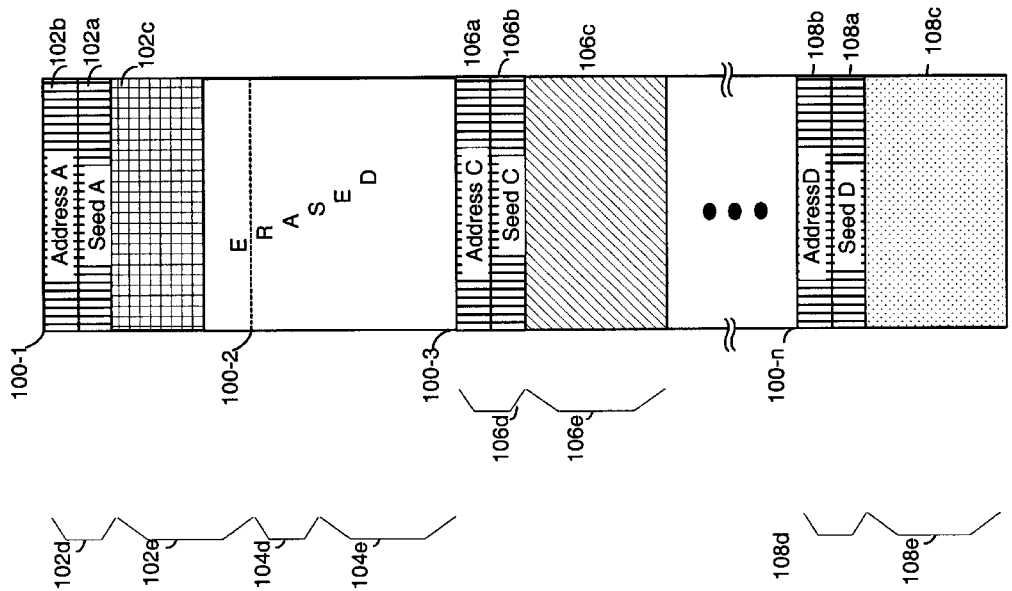
FIG. 4 is a block diagram showing another defective write operation performed by a storage device having an example sector configuration in accordance with one embodiment of the present invention.

In yet another example, as shown in FIG. 4, the exact same data shown in FIG. 2, is stored in storage device 20 but a subsequent faulty erase operation to erase the sector having LBA 100-2, erases not only that sector but portions of the sector above it. Since the sector having LBA 100-1 now only contains portions of test data 102*c*, the decoding of its contents will result in a seed that will not correspond to seed 102*b*, causing program 16 to render an I/O fault condition.

FIG. 5 is a flow diagram showing a method of writing test data into addressable memory locations defined in a storage device, in accordance with one preferred embodiment of the present invention. At reference 200, a storage device is initialized by formatting available memory to have a logical block-addressing scheme.

At reference 202, a seed is generated, which is preferably four bytes long. A seed is a psuedo-random number generator input parameter value, such as generator 17*a* described above. Generating the seed may be accomplished in any way although preferably it is an integer number and is provided by using time values, such as those provided by a computer's system clock.

At reference 204, the random number generator is initialized with the seed, resulting in the generation of test data representing a sequence of numbers that approximate a true random sequence.

At reference 206, a target address is selected. The selection of the target address is based on the capacity of the storage device tested and the type of testing routine desired although this is not intended to limit the invention in any way.

At reference 208, the target address, seed, and test data are written into a memory at a location associated with the target address, such as the beginning address of a sector or page. The total size of the target address, seed and test data do not exceed the sector size. The target address and seed are stored in a header defined within each memory location. Preferably, the header includes an address portion and a seed portion with each portion having a size of four (4) bytes each. The remaining memory location is filled with the test data generated in reference 204.

At reference 210, if another memory location requires testing, the program flow returns to reference 202. Otherwise, the program flow for program code 16 ends at reference number 212.

FIG. 6 is a program flow for testing the storage operation of a storage device having data stored in accordance with yet another preferred embodiment of the present invention. At reference 230, a target logical block address representing a sector, page, or equivalent unit of memory space is selected and its entire contents read.

At reference 232, the data is parsed into a header portion and data portion. Preferably, the header portion is defined as the first eight bytes of the sector, while the data portion is defined as the remaining memory space in the sector. For example, if the storage device being tested uses a sector size of 512 bytes, the first eight bytes starting from the target logical block address of the sector are defined as the header portion. The remaining byte locations in the sector are defined as its data portion.

At reference 234, a target address and a seed are parsed from the header portion.

At reference 236, the parsed target address is compared with the starting logical block address of the sector being tested. If the addresses match, then the program flow proceeds to reference 238. Otherwise, an I/O fault is rendered as shown at reference 240.

At reference 238, a decoded seed is generated by using the entire contents of the data portion as an input parameter to a decoder having a seed generation algorithm that is a complement of the psuedo-random number generator algorithm used to generate the test data stored in the data portion parsed at reference 232.

At reference 240, the seed generated is compared with the seed read from the header portion, which is preferably stored within the fifth through eighth bytes of the header portion.

At reference 240, if the seeds are equal in value, a successful result is indicated. Otherwise, at reference 242, an I/O fault is indicated.

The methods disclosed in FIGS. 5 and 6 facilitate the testing of a storage device because the test data written into a sector or page, or any unit of memory space can be subsequently read and verified without the need to keep a prior copy of the test data. All information required to verify a unit of memory space filled with test data is self-contained in the unit of memory space.

Figures 7, 8, 9:
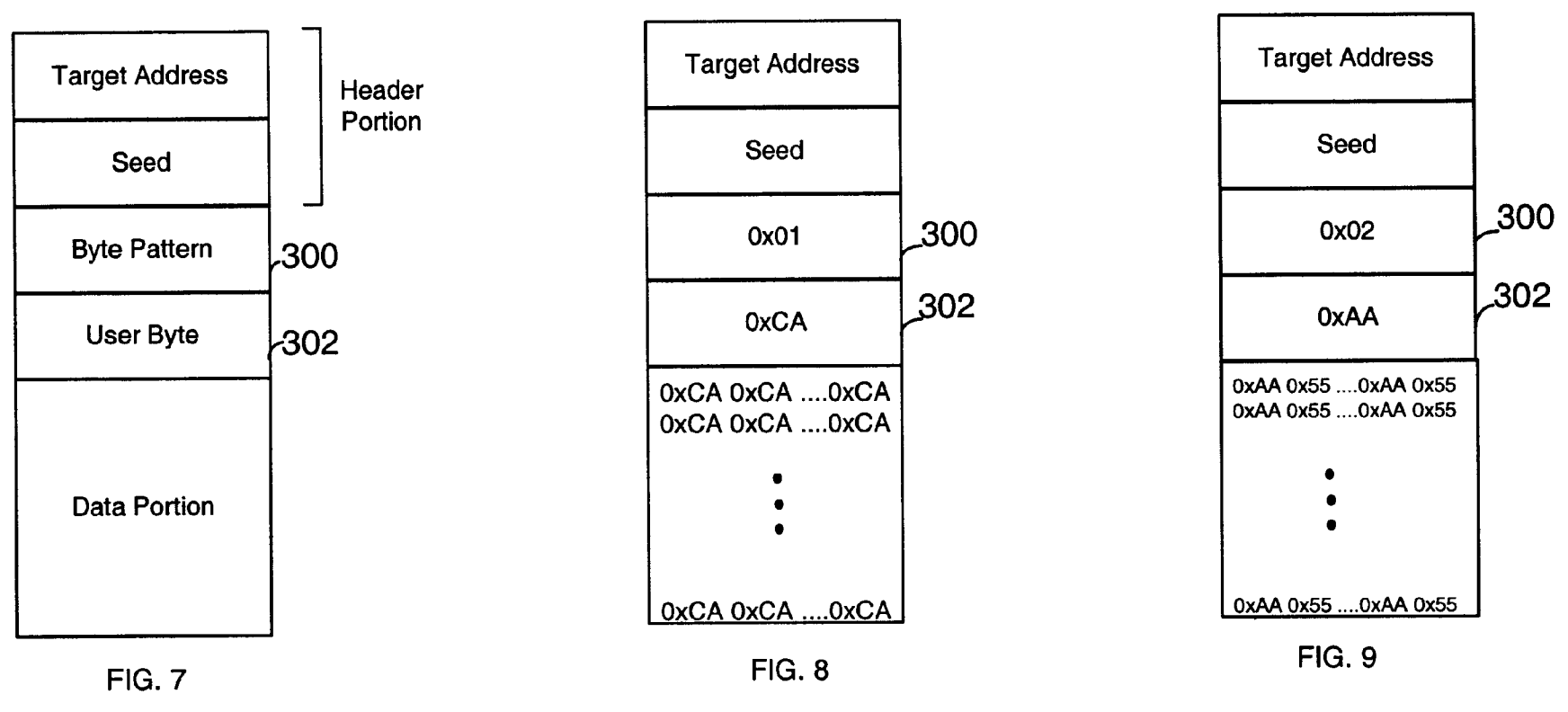

FIG. 7 is a block diagram showing another example sector configuration for a storage device selected for testing in accordance with yet another embodiment of the present invention. Like the sector configuration in FIG. 2, it includes a header portion comprising a target address and seed and a data portion for holding test data. Unlike the sector configuration shown in FIG. 2, however, it also includes two additional fields each four (4) bytes in length. The byte pattern field 300 contains the type of byte pattern that is used for test data. The user byte field 302 contains the actual starting byte pattern to be used. Each field is four bytes long although only two bytes of each field are used. This results in a data portion 496 bytes in length for a 512-byte sector containing a header eight (8) bytes in length.

Table 1 illustrates the types of byte patterns that may be selected and their corresponding indices.

TABLE 1

| Byte Pattern Type | Byte Pattern Index |
| --- | --- |
| Random Byte | 0 |
| Fixed Byte | 1 |
| Alternate Byte | 2 |
| Alternate Page | 3 |
| Incremental Byte | 4 |
| Decremental Byte | 5 |
| Incremental Page | 6 |
| Decremental Page | 7 |
| All "0 × AA" | 8 |
| All "0 × 55" | 9 |
| All "0 × 00" | 10 |
| All "0 × FF" | 11 |

The first column lists the possible byte pattern types, while the second column contains an index to the byte pattern types listed in the first column. The byte pattern types and index are not intended to be limiting in any way but are shown to illustrate an additional variation of the present invention that enables the use of other types of test data besides seed generated random byte patterns. Selecting a random byte pattern results in test data that is generated using a seed. Selecting this byte pattern type will cause the present invention to write to a selected sector using random test data in the manner described above. In addition, including the byte pattern field 300 and user byte field 302 in every sector selected for testing permits subsequent verification of the test data written to the sector since the values stored in byte pattern field 300 and user byte field 302 are be used to indicate the type of byte pattern and test data, respectively, to expect when reading the sector.

If it is desired to use test data that has a fixed byte pattern, a selected byte value is written repeatedly up to the capacity of each data portion of a set of sectors selected for testing. The byte value used and the index corresponding to the fixed byte pattern type are written to the user byte field 302 and byte pattern field 300, respectively. Thus, as shown in FIG. 8, the selection of a Fixed Byte pattern results in test data that contains repeated instances of the value contained in the user byte field 302, permitting the present invention to validate the data upon a subsequent read operation. The present invention will read the data stored in a selected sector and determine whether that data matches the test data that was previously written to the sector. This validation process includes reading byte pattern field 300 and user byte field 302. If byte pattern field 300 contains a value that does not match the index value of the Fixed Byte pattern as shown in Table 1, or if every byte in the data portion of the sector does not match the value in user byte field 302, then it will return a fault condition.

Referring now to FIG. 9, selecting an Alternate Byte pattern type generates test data having a sequence of byte pairs, each having a selected starting value and an "alternate" value. The alternate value is an ones complement of the starting value. For example, a starting value of 0×AA has an ones complement of 0×55. Upon generating and writing the test data into the data portion of a sector selected for testing, the index corresponding to the Alternate Byte type, as shown in Table 1, is written into byte pattern field 300 and the starting value into user byte field 302. Since the byte pattern and starting value are stored in the sector selected for testing, testing the I/O functionality of a storage device having the sector can be performed without tracking the test data written into the sector through an external table. Instead, the sector contains the necessary information to permit the present invention to validate test data read from the data portion of the sector. This validation process includes reading byte pattern field 300 and user byte field 302. If byte pattern field 300 contains a value that does not match the index value of the Fixed Byte pattern as shown in Table 1, or if every byte pair in the data portion of the sector does not start with the value in user byte field 302 or end with its alternate value, then the present invention will return a fault condition.

As shown in FIG. 10, selecting an alternate page byte pattern type generates test data that is stored in two sectors, with the first sector having a data portion filled entirely with a selected starting value and the second sector having a data portion filled entirely with an alternate value. The alternate value is an ones complement of the starting value. For example, a starting value of 0×AA has an ones complement of 0×55. Upon generating and writing the test data into the data portions of the two sectors selected for testing, the index corresponding to the Alternate Page byte pattern type, as shown in Table 1, is written into byte pattern field 300 and the starting value into user byte field 302 of starting sector 304. The alternate page byte pattern type is written into byte pattern field 300 of ending sector 306 but the alternate value is written into user byte field 302, which is 0×55 in this example. Since the byte pattern and starting value are stored in each sector, testing the I/O functionality of a storage device having the sector can be performed without tracking the test data used through the use of an external table. Instead, the first sector contains the necessary information to permit the present invention to validate test data read from the data portions of both sectors. This validation process includes reading byte pattern field 300 and user byte field 302. If byte pattern field 300 contains a value that does not match the index value of the Fixed Byte pattern as shown in Table 1, the present invention will expect a different byte pattern than the one used for the data portions of the sectors selected for testing, eventually resulting in a fault condition. Similarly, if every byte in the data portion of the first sector does not match the value in the user byte field of the first sector, or if every byte in the data portion of the second sector does not match the value in the user byte field of the second sector, then the present invention will return a fault condition.

Referring now to FIG. 11, selecting an incremental byte pattern type generates test data having repeating sequences, each having byte values that increase sequentially. Each sequence begins with a selected starting value and incrementally increases until a maximum value is reached. The maximum value is equal to the maximum value of the byte width used by the present invention. For example, if the byte width is eight (8) bits, then the maximum value is 0xFF. Once the maximum value is reached, the sequence begins at a selected minimum binary value, such as 0x00, and incrementally increases until the value immediately preceding the starting value is reached (hereinafter referred to as the "ending value"). Upon reaching the ending value, the sequence is repeated until the entire data portion is filled with test data comprised of the sequences. For example, if the selected starting value is equal to 0xFD, then the incremental sequence includes the following values: 0xFD, 0xFE, 0xFF, 0x00 . . . 0xFC.

Upon generating and writing the test data into the data portion of a sector selected for testing, the index corresponding to the alternate byte pattern type, as shown in Table 1, is written into byte pattern field 300 and the selected starting value into user byte field 302. Since the byte pattern and starting value are stored in the sector selected for testing, testing the I/O functionality of a storage device having the sector can be performed without tracking the test data written into the sector through an external table. Instead, the sector contains the necessary information to permit the present invention to validate test data read from the data portion of the sector. This validation process includes reading byte pattern field 300 and user byte field 302. If byte pattern field 300 contains a value that does not match the index value of the Fixed Byte pattern as shown in Table 1, or if every byte pair in the data portion of the sector does not start with the value in user byte field 302 or end with its maximum value, then the present invention will return a fault condition.

Figure 12:
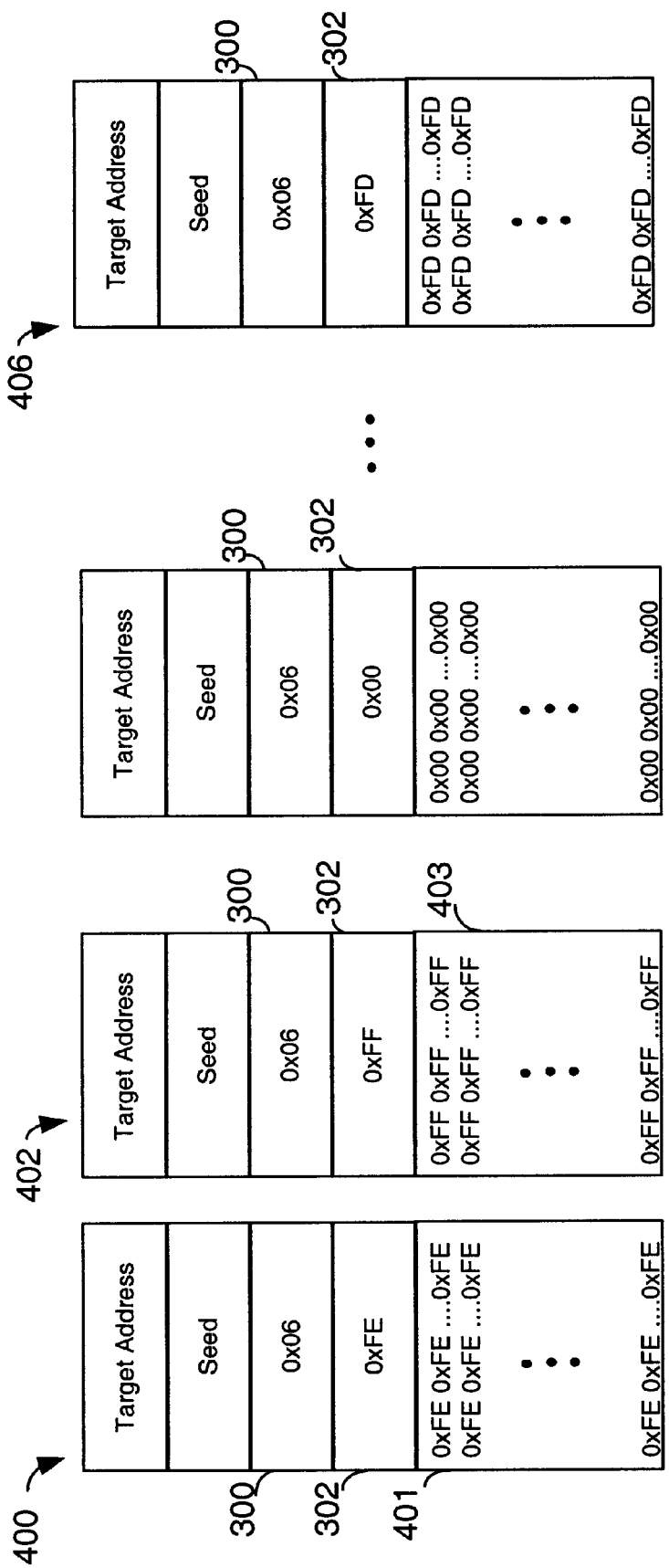

As shown in FIG. 12, selecting an incremental page pattern type generates test data comprised of a sequence of values that spans a number of pages. Like the sequence generated for the incremental byte pattern type, the sequence for the incremental page pattern begins with a selected starting value and incrementally increases until the maximum value of the byte width used in the present invention is reached. For example, if the byte width is eight (8) bits, then the maximum value is 0xFF. Once the maximum value is reached, the sequence begins at a selected minimum binary value, such as 0x00, and incrementally increases until the ending value is reached.

However, unlike the incremental byte pattern type disclosed above, each value within the sequence is stored repeatedly in a data portion of a sector, resulting in the sequence spanning a number pages. For example, if the selected starting value is equal to 0xFD, then the incremental sequence includes the following values: 0xFE, 0xFF, 0x00 . . . 0xFC. Each value is repeatedly stored in a selected data portion until the data portion is filled. Thus, as seen in FIG. 12, the sequence begins with a sector 400 having a data portion 401 filled with the selected starting value of 0xFE, a sector 402 having a data portion 403 filled with the next value in the sequence, which is 0xFF, and until the sequence is completed, which in this example ends with the value of 0xFD in sector 406. Upon reaching the ending value, the sequence may be repeated until a selected number of pages are used (not shown).

Upon generating and writing the test data into the sectors, the index corresponding to the incremental page pattern type, as shown in Table 1, is written into the byte pattern field 300 of each sector selected for testing. The user byte fields of each sector are filled with the byte value written in the sector's data portion. Since the byte pattern and starting value are stored in each sector selected for testing, testing the I/O functionality of a storage device can be performed without tracking the test data written into each sector through an external table. Instead, each sector selected for testing contains the necessary information to permit the present invention to validate test data read from the data portion of each sector. This validation process includes reading byte pattern field 300 and user byte field 302. If byte pattern field 300 contains a value that does not match the index value of the incremental page byte pattern as shown in Table 1, or if every byte pair in the data portion of the sector does not start with the value in user byte field 302 or end with its maximum value, then the present invention will return a fault condition. Similarly, if every byte in the data portion of the first sector does not match the value in the user byte field of a sector selected for testing, then the present invention will return a fault condition.

The implementation of decremental byte and page patterns (not shown) to define test data is similar to that of the incremental byte and page patterns disclosed above, except the generated test data includes values that decrement sequentially beginning from a selected starting value and ending at a value that is greater than but immediately precedes the selected starting value in the decrementing sequence. For example, if the starting value selected is 0x03, the sequence will be: 0x03, 0x02, 0x01, 0x00, 0xFF . . . 0x04. For a decremental page pattern, the sequence spans a number of sectors, with each sector containing a value in the sequence that is repeatedly written in the sector's data portion until the data portion is filled.

The remaining byte patterns in the table results in a fixed pattern similar to that described for the fixed byte pattern type described above. For example, if the "All 0xAA" byte pattern is selected, the data portion of the sector selected for testing is filled with repeated instances of the value 0xAA. The corresponding byte pattern index and the value 0xAA are then written to the byte pattern and the user byte fields, respectively, of the sector, permitting verification of the test data without the need to track the type of test data used using an external data table.

Additional embodiments of the present invention may include embedding the steps of the method of the present invention into a Field Programmable Gate Array (FPGA) as is well-known in the art, or using an integrated circuit design program such as VHDL to describe the method, thus hard coding the method in an application-specific integrated circuit (ASIC). The skill necessary to perform such embedding and hard coding is well known to those of ordinary skill in the art. While preferred embodiments are disclosed herein, many variations are possible which remain within the concept and scope of the invention, and these variations would become clear to one of ordinary skill in the art after perusal of the specification, drawings and claims herein.

What is claimed is:

1. A method of writing test data in a memory space, comprising:

generating a header having an address representing the location of the memory space and a seed value;

generating a set of values using said seed value; and storing said header and said set of values in the memory space.

2. The method of claim 1, wherein the memory store is mapped to logical block addresses.

3. The method of claim 1, wherein said generating a set of values using said seed value includes using a random number generator having said seed value as an input.

4. The method of claim 1, wherein said storing said header and said set of values includes storing said header in a first portion of the memory space and said set of values in a second portion of said memory space.

5. A method of testing the I/O functionality of a memory store, comprising:

selecting a byte pattern index value;

generating a first set of test data using said byte pattern index value and a user byte value;

storing a sector address, said byte pattern index value, said user byte value, and said first set of test data in a sector;

reading said sector address, said byte pattern index value, said user byte value, and said first set of test data from said sector;

generating a second set of test data using said byte pattern index value and said user byte value; and comparing said second set of test data with the first set of test data.

6. The method of claim 5, wherein said generating said first set of test data includes generating a seed and using said seed to generate said first set of test data, if said byte pattern index value corresponds to a random byte pattern.

7. The method of claim 6, wherein said generating said first set of test data includes using a fixed byte pattern to generate said first set of test data, if said byte pattern index value corresponds to a fixed byte pattern.

8. The method of claim 5, wherein said generating said first set of test data includes generating a sequence of byte pairs, each having a selected starting value and an alternate value.

9. The method of claim 5, wherein said generating said first set of test data includes generating a sequence of repeating sequences, each having byte values that increase sequentially starting from a selected start value.

10. The method of claim 5, wherein said generating said first set of test data includes generating a sequence of repeating sequences, each having byte values that decrease sequentially starting from a selected start value.

11. An apparatus for writing test data in a memory space within a memory store, comprising:

a computer having a storage device interface controller;

a storage device having an interface suitable for coupling to said storage device interface controller and the memory store;

a first function for generating a header having an address representing the location of the memory space in the memory store, and a seed value;

a second function for generating a set of values using said seed value; and a third function for storing said header and said set of values in the memory space.

12. An apparatus for testing a memory space within a memory store, comprising:

a computer having a storage device interface controller;

a storage device having an interface suitable for coupling to said storage device interface controller and the memory store;

a first function for selecting a byte pattern index value;

a second function for generating a first set of test data using said byte pattern index value and a user byte value;

a third function for storing the address of the memory space, said byte pattern index value, said user byte value, and said first set of test data in the memory space;

a fourth function for reading the address of the memory space, said byte pattern index value, said user byte value, and said first set of test data from the memory space;

a fifth function for generating a second set of test data using said byte pattern index value and said user byte value; and a sixth function for comparing said second set of test data with the first set of test data.

13. The apparatus of claim 12, wherein said second function for generating said first set of test data includes generating a seed and using said seed to generate said first set of test data, if said byte pattern index value corresponds to a random byte pattern.

14. The apparatus of claim 13, wherein said second function for generating said first set of test data includes using a fixed byte pattern to generate said first set of test data, if said byte pattern index value corresponds to a fixed byte pattern.

15. The apparatus of claim 12, wherein said second function for generating said first set of test data includes generating a sequence of byte pairs, each having a selected starting value and an alternate value.

16. The apparatus of claim 12, wherein said second function for generating said first set of test data includes generating a sequence of repeating sequences, each having byte values that increase sequentially starting from a selected start value.

17. The apparatus of claim 12, wherein said second function for generating said first set of test data includes generating a sequence of repeating sequences, each having byte values that decrease sequentially starting from a selected start value.

18. A computer program product embodied in a machine-readable medium, the computer program product comprising:

a first program for generating a header having an address representing the location of the memory space and a seed value;

a second program for generating a set of values using said seed value; and third program for storing said header and said set of values in the memory space.

* * * * *